United States Patent
Yagisawa et al.

(10) Patent No.: US 6,553,277 B1
(45) Date of Patent: Apr. 22, 2003

(54) METHOD AND APPARATUS FOR VACUUM TREATMENT

(75) Inventors: Shoji Yagisawa, Austin, TX (US); Hiromitsu Kanbara, Kawasaki (JP); Hiroshi Nishikawa, Hoya (JP); Takashi Ito, Tokyo-To (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/959,764

(22) PCT Filed: May 2, 2000

(86) PCT No.: PCT/JP00/02905

§ 371 (c)(1),
(2), (4) Date: Nov. 6, 2001

(87) PCT Pub. No.: WO00/68986

PCT Pub. Date: Nov. 16, 2000

(30) Foreign Application Priority Data

May 7, 1999  (JP) .................................... 11/126952

(51) Int. Cl.[7] ........................ H05H 1/00; H01L 21/70
(52) U.S. Cl. ................... 700/204; 700/121; 700/123; 700/112; 700/108
(58) Field of Search ................ 700/204; 438/5–10, 438/14, 17

(56) References Cited

U.S. PATENT DOCUMENTS 5,444,637 A * 8/1995 Smesny et al. .............. 438/16
5,571,366 A * 11/1996 Ishii et al. ............... 118/723 I

FOREIGN PATENT DOCUMENTS

| EP | 0 644 409 | 3/1995 |
|----|-----------|--------|
| JP | 3-71630 | 3/1991 |
| JP | 6-50824 | 2/1994 |
| JP | 6-76193 | 3/1994 |
| JP | 6-163340 | 6/1994 |
| JP | 7-12667 | 1/1995 |
| JP | 7-106392 | 4/1995 |
| JP | 9-189613 | 7/1997 |
| JP | 10-199869 | 7/1998 |

* cited by examiner

*Primary Examiner*—Leo Picard
*Assistant Examiner*—Michael D Masinick
(74) *Attorney, Agent, or Firm*—Smith, Gambrell & Russell, LLP

(57) ABSTRACT

A method of vacuum treatment is performed using a vacuum treatment system (1) comprising a vacuum treatment unit (31) for treating a wafer (W) placed on a wafer stage (10) and a controller (51) for controlling the vacuum treatment unit (31). A sensor wafer (11) of substantially the same shape and size as a wafer (W), which includes a detector element (11*d*) for detecting data about the state of a vacuum treatment and a data processing element (11*p*) for processing the detected data, is placed on the wafer stage (10) and treated in a vacuum by the vacuum treatment unit (31). While the sensor wafer (11) is subjected to a vacuum treatment, data on the state of the vacuum treatment is detected and processed. Based on the processed data, the controller (51) controls the vacuum treatment unit (31) to treat the wafer (W).

13 Claims, 6 Drawing Sheets

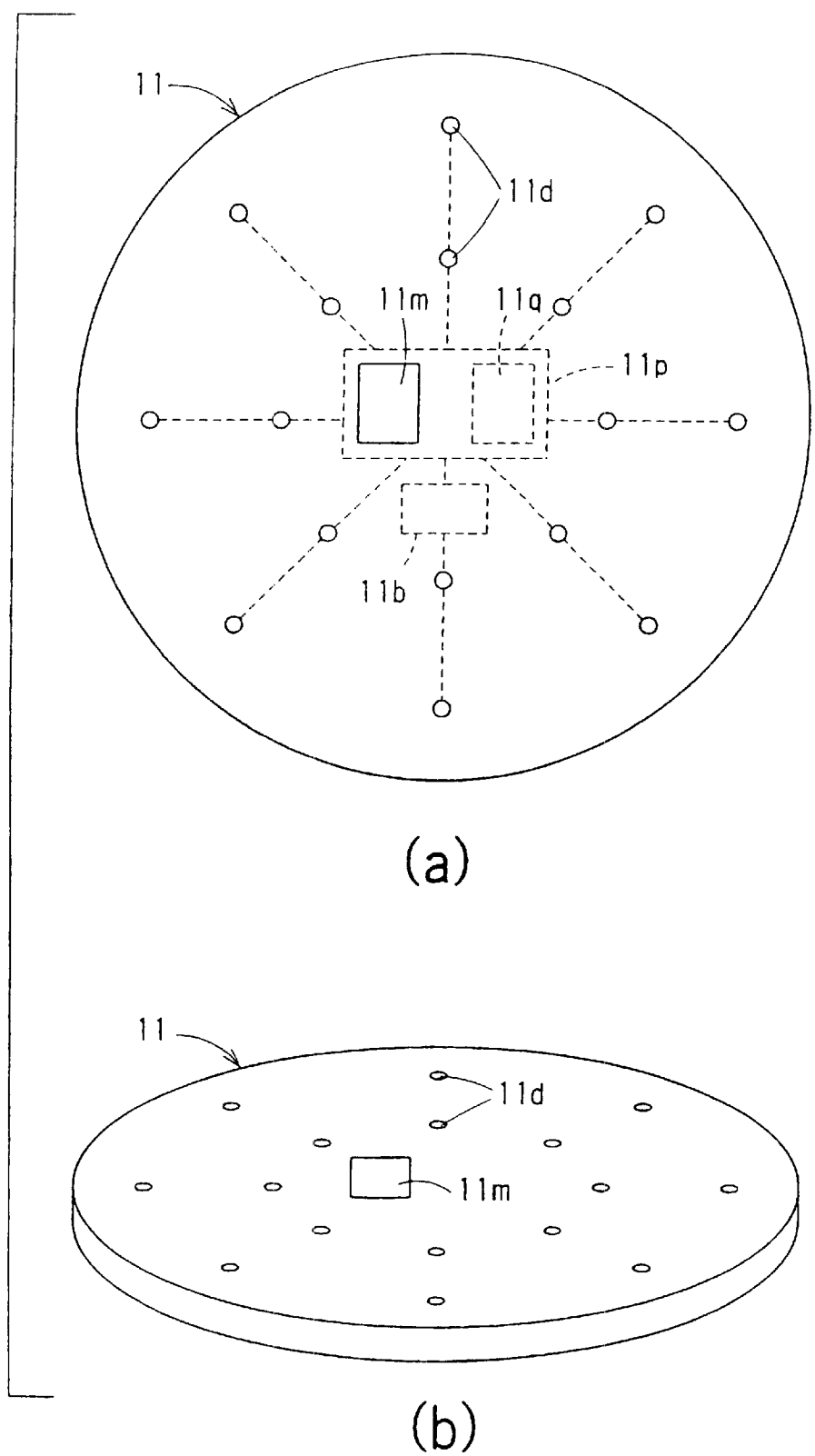
F I G. 2

METHOD AND APPARATUS FOR VACUUM TREATMENT

FIELD OF THE INVENTION

This invention relates to a vacuum processing method of using a vacuum processing unit including: a stage on which a substrate to be processed is adapted to be placed; a vacuum processing mechanism that conducts a vacuum process to the substrate to be processed placed on the stage; and a controller that controls the vacuum processing mechanism. In addition, this invention relates to the vacuum processing unit. Furthermore, this invention relates to a sensor substrate that is placed on the stage.

BACKGROUND OF THE INVENTION

The structure of a conventional vacuum processing unit is explained with reference to FIG. 6.

FIG. 6 shows a schematic sectional view of an etching unit 100 that is an example of a vacuum processing unit. In the etching unit 100, a processing chamber 102 is formed in a processing container 104 that has a substantially cylindrical shape, that can be hermetically closed and that is made of aluminum whose surface has been subjected to an anodic oxidation process. The processing container 104 itself is connected to ground via a ground wire 106.

An insulating support plate 108 is provided in a base portion of the processing chamber 102. A substantially cylindrical susceptor (stage) 110 that forms a lower electrode in order to place a substrate to be processed (for example, a 6-inch wafer) W thereon is contained in a vertically movable manner above the insulating support plate 108.

The susceptor 110 is supported by an elevation shaft 112 that freely passes through the insulating support plate 108 and a base portion of the processing container 104. The elevation shaft 112 is vertically movable by means of a driving motor 114 disposed outside the processing container 104. Thus, when the driving motor 114 operates, the susceptor 110 can be vertically moved in a direction shown by a two-way arrow in FIG. 6. In addition, in order to secure airtightness of the processing chamber 102, an extendable hermetic bellows 116 is arranged around the elevation shaft 112 between the susceptor 110 and the insulating support plate 108.

The susceptor 110 is made of aluminum whose surface has been subjected to an anodic oxidation process. A heating means (not shown), such as a ceramics heater, and a cooling-medium circulating way (not shown), which is to cause a cooling medium from an outside cooling-medium source (not shown) to circulate, are provided in the susceptor 110. The heating means and the cooling-medium circulating way are formed to be automatically controlled by a temperature controlling mechanism (not shown). Thus, it is possible to maintain a substrate to be processed W on the susceptor 110 at a predetermined temperature.

An electrostatic chuck 118 for sticking to and holding the substrate to be processed W is provided on the susceptor 110. The electrostatic chuck 118 has a structure wherein an electric conductive thin film is sandwiched between upper and lower polyimide resin elements. The electrostatic chuck 118 is adapted to be applied a voltage (for example, a voltage of 1.5 kV to 2.0 kV) from a high-voltage direct-current source 120 that is disposed outside the processing container 104. By means of coulomb force created by applying the voltage, the substrate to be processed W is adapted to be stuck to and held by an upper surface of the electrostatic chuck 118.

On an upper peripheral area of the susceptor 110, a substantially circular focus ring 122 is disposed surrounding the electrostatic chuck 118. The focus ring 122 is made of crystal that has insulating performance, and has a function to restrain a diffusion of plasma that may be generated between the susceptor 110 and an upper electrode 124 as described below and a function to cause ions in the plasma effectively to reach the substrate to be processed W.

A substantially disk-shaped upper electrode 124 is arranged at a position facing a placing surface of the susceptor 110. The upper electrode 124 is made of electric conductive single-crystal Silicon and has a plurality of through-holes 124a. An upper-electrode supporting member 126 that is made of electric conductive aluminum and that has substantially the same diameter as the upper electrode 124 is arranged above the upper electrode 124.

An opening 126a is formed in the upper-electrode supporting member 126 on a side of the upper electrode 124. Thus, in a state wherein the upper electrode 124 is attached to the upper-electrode supporting member 126, a space 130 is formed between the upper electrode 124 and the upper-electrode supporting member 126.

A substantially circular shield ring 132 that is made of crystal having insulating performance is arranged from a lower peripheral portion of the upper electrode 124 to a central portion of an outside curcumferential surface of an insulating ring 128. The shield ring 132 has a function to form a gap together with the focus ring 122 and to restrain a diffusion of plasma, the gap being narrower than a gap between the electrostatic chuck 118 and the upper electrode 124.

A gas inlet port 134 is connected to a substantially central upper portion of the space 130. A gas inlet tube 138 is connected to the gas inlet port 134 via a valve 136. Respective corresponding gas supply sources 152, 154 and 156 are connected to the gas inlet tube 134 via valves 140, 142 and 144 and mass flow controllers (MFC) 146, 148 and 150 that are for adjusting respective corresponding flow rates.

Ar can be freely supplied from the gas supply source 152. $O_2$ can be freely supplied from the gas supply source 154. $C_3F_6$ can be freely supplied from the gas supply source 156. The respective gases from the gas supply sources 152, 154 and 156 are introduced into the processing chamber 102 via the gas inlet tube 138, the gas inlet port 134, the space 130 and the through-holes 124a, and then uniformly flow toward a surface to be processed of the substrate to be processed W.

A discharging tube 160 leading to a vacuum means 158 such as a vacuum pump is connected to a lower portion of the processing container 104. Thus, a vacuum of an optional level such as several mTorr to several hundred mTorr can be created in the processing chamber 102 via a gas-discharging plate 162 consisting of for example a punched plate, and the vacuum can be maintained.

Electric power from a first high-frequency power source 164 that outputs high frequency power whose frequency is about several hundred kHz (for example 800 kHz) can be supplied to the susceptor 110 via a matching device 166. On the other hand, electric power from a second high-frequency power source 168 that outputs high frequency power whose frequency is not less than 1 MHz (for example 27.12 MHz), which is greater than that of the first high-frequency power source 164, can be supplied to the upper electrode 124 via a matching device 170 and the upper-electrode supporting member 126.

Next, an operation in a case wherein an etching process is conducted to a substrate to be processed W, which consists of for example $SiO_2$, by using the above etching unit 100 is explained below.

At first, the substrate to be processed W is placed on the susceptor 110. Then, a predetermined voltage from the high-voltage direct-current source 120 is applied to the electric conductive thin film in the electrostatic chuck 118, so that the substrate to be processed W is sucked to and hence held by the electrostatic chuck 118. Since the susceptor 110 is adjusted to a predetermined temperature by means of a temperature-adjusting means not shown, a surface temperature of the substrate to be processed W held on the susceptor 110 is set at a desired temperature (for example not more than 120° C.) even when the substrate is processed.

Then, a vacuum is created in the processing chamber 102 by means of the vacuum means 158. In addition, gases necessary for the etching process are supplied at respective predetermined rates from the gas supply sources 152, 154 and 156, so that a pressure in the processing chamber 102 is set and maintained at a predetermined vacuum level such as 40 mTorr.

Herein, the respective gases Ar, $O_2$ and $C_3F_6$ supplied from the gas supply sources 152, 154 and 156 are adjusted to the predetermined flow rates by means of the respective corresponding mass-flow controllers 146, 148 and 150 and the valves 140, 142 and 144, and then mixed. The mixed gas is introduced onto the substrate to be processed W via the gas inlet tube 138, the gas inlet port 134, the space 130 and the through-holes 124a.

In the mixed gas, for example, the flow rates of the respective gases are adjusted in such a manner that a flow-rate ratio of $O_2$ to $C_3F_6$ is $0.1 \leq O_2/C_3F_6 \leq 1.0$, and open levels of the respective valves 140, 142 and 144 are adjusted in such a manner that a partial pressure of $C_3F_6$ is 0.5 mTorr to 2.0 mTorr.

Then, when a high-frequency electric power having a frequency of 27.12 MHz and a power such as 2 kW is supplied to the upper electrode 124 from the second high-frequency power source 168, plasma is generated between the upper electrode 124 and the susceptor 110. At the same time, a high-frequency electric power having a frequency of 800 kHz and a power such as 1 kW is supplied to the susceptor 110 from the first high-frequency power source 164.

The process gas in the processing chamber 102 is decomposed by the generated plasma to generate etchant ions. The etchant ions etch the $SiO_2$ film of the surface of the substrate to be processed W, while incident speed of the etchant ions are controlled by the relatively low high-frequency supplied to the susceptor 110.

More detailed explanation of the above etching unit 100 is disclosed by Japanese Patent Laid-Open Publication No.10-199869.

In order to properly control a vacuum processing unit, it is effective to detect information about a processing state by the vacuum processing unit. As a technique for detecting the information about the processing state by the vacuum processing unit, a technique of mounting various sensors in the vacuum processing unit has been developed.

Such a technique is disclosed by for example Japanese Patent Laid-Open Publication No.6-76193. The invention disclosed in Japanese Patent Laid-Open Publication No.6-76193 is an invention wherein: a sensor and a transmitter are mounted in a vacuum processing unit, and information measured by the sensor is transmitted outside of the vacuum processing unit by the wireless transmitter. The invention has an advantage that wiring is unnecessary for transmitting the information measured by the sensor, so that the information measured by the sensor can be easily obtained even when the vacuum processing unit is in a vacuum state. In addition, Japanese Patent Laid-Open Publication No.6-76193 also refers to it that the sensor and the transmitter can be mounted on a substrate to be processed.

However, in the content disclosed by Japanese Patent Laid-Open Publication No.6-76193, as shown in respective drawings thereof, the sensor protrudes from on the substrate to be processed.

Inventors of this invention have found that it is troublesome to process the substrate to be processed wherein the sensor or the transmitter is protruded from on the substrate to be processed.

The first reason thereof is that: a process to be conducted by the vacuum processing unit may be conducted not in accordance with a specification thereof, owing to the sensor or transmitter protruded from on the substrate to be processed, because a design of the vacuum processing unit for the specification is based on a supposed horizontal surface of the substrate to be processed.

The second reason thereof is that: mounting of the sensor and the transmitter on each substrate to be processed, which is a product, is not practical because of various costs, while a following problem is generated when a substrate to be processed, from which the sensor and the transmitter are protruded, is used as a kind of "model substrate". That is, although the sensor and the transmitter are protruded from the "model substrate", a substrate to be processed for an actual product has no such a protrusion, so that it cannot be known whether information obtained from the sensor of the "model substrate" is truly applicable for the process to the substrate to be processed as the product. For example, it can be thought that a state of the gas flows in the vacuum processing unit may delicately influence the state of the vacuum process, and that the state of the gas flows may be greatly changed by presence of such a protrusion.

In addition, as a technique for providing a sensor on a "model substrate" in such a manner that the sensor is not protruded from the substrate, there is a technique disclosed by Japanese Patent Laid-Open Publication No.9-189613 by the applicant of this invention. The invention of the publication is an invention wherein a temperature-measurement point is formed in the substrate, and a measured signal is taken from the point via a stage.

FIG. 7 is a plan view of a wafer for a temperature measurement 201 that is disclosed in the above publication. A substrate 202 for the wafer for the temperature measurement 201 is made of the same silicon as that forming a common semiconductor device.

For example, five rank and five file temperature-measurement points, that is, temperature-measurement points A1 to A5, B1 to B5, C1 to C5, D1 to D5 and E1 to E5 are formed on an upper surface of the wafer for the temperature measurement 201. These temperature-measurement points A1 to E5 are patterned onto the substrate 202. A device structure thereof is patterned onto the substrate 52 by using an etching process or a film-forming process, which are common processes for manufacturing semiconductor devices.

For example, if an alumel-chromel-thermocouple is used, as shown in FIG. 8, an interlayer insulating film 203 formed on the silicon substrate 202 is etched into longitudinal grooves in accordance with a predetermined pattern, the grooves are then filled with alumel 204 by a metal-deposition process, chromel 205 is then patterned thereon in belt-shaped patterns of a lateral direction, and contact points thereof can be used as the temperature-measurement points.

The respective temperature-measurement points A1 to E5 that have been patterned on the substrate 202 via the above steps are in a uniformly-formed state, because the points are pattered on the substrate 202, differently from a conventional case wherein the points are attached to the substrate by means of adhesive. Thus, the points are free from conventional problems such as coming off of the adhesive, unevenness of temperature depending on an adhesively attached state or contamination in the processing chamber owing to the coming off of the adhesive.

However, in the invention disclosed by Japanese Patent Laid-Open Publication No.9-189613, the detected information is limited to the temperature and taken via a signal processor 206 and a terminal board 207 as it is. Thus, wiring is basically necessary correspondingly to the number of measurement points.

This invention is intended to solve the above problems. The object of this invention is to provide a vacuum processing method, a vacuum processing unit and a sensor substrate as a "model-substrate", in which an outside shape of a sensor substrate as a "model-substrate" is not different from a substrate to be processed for a product, information detected by the sensor substrate is not limited to temperature, and a process of transmitting the detected information is more convenient.

In addition, the term "vacuum process" in the specification is used as a term having a very broad meaning, that is, generally represents "any process in a closed space whose pressure can be reduced below atmospheric pressure"

SUMMARY OF THE INVENTION

This invention is a vacuum processing method of using a vacuum processing unit including: a stage on which a substrate to be processed is adapted to be placed; a vacuum processing mechanism that conducts a vacuum process to the substrate to be processed placed on the stage; and a controller that controls the vacuum processing mechanism; comprising; a step of placing a sensor substrate on the stage part, the sensor substrate being formed in such a manner that the sensor substrate has substantially the same shape and substantially the same size as the substrate to be processed placed on the stage, the sensor substrate having a detecting device that detects information about a vacuum processing state and an information-processing device that processes the information detected by the detecting device; a step of conducting a vacuum process to the sensor substrate by means of the vacuum processing mechanism; a step of detecting information about a vacuum processing state by means of the detecting device when the sensor substrate is subjected to the vacuum process; a step of processing the information detected by the detecting device by means of the information-processing device; a step of removing the sensor substrate from the stage; a step of placing a substrate to be processed on the stage; and a step of conducting a vacuum process to the substrate to be processed, by controlling the vacuum processing mechanism by means of the controller based on the information about the vacuum processing state processed by the information-processing device.

According to the vacuum processing method of the invention, since the sensor substrate is formed in such a manner that the sensor substrate has substantially the same shape and substantially the same size as the substrate to be processed, the information about the vacuum processing state detected by the detecting device of the sensor substrate is very useful information for a vacuum process to the substrate to be processed.

In addition, according to the vacuum processing method of the invention, since the information detected by the detecting device is processed by the information-processing device of the sensor substrate, a process of transmitting the detected information is more convenient.

In the vacuum processing method of the invention, if the vacuum process is a plasma process, in particular a plasma-etching process, it is especially effective that the sensor substrate has substantially the same shape and substantially the same size as the substrate to be processed, because identity of process environment such as gas flow environment can be secured.

In addition, in the vacuum processing method of the invention, it is preferable that the substrate to be processed is a semiconductor wafer or a glass substrate for an LCD.

In addition, in the vacuum processing method of the invention, it is preferable that the information-processing device has a storing device that stores the information detected by the detecting device. In the case, the information stored by the storing device may be transmitted to and analyzed by the controller. Alternatively, an analyzing part can be provided separately from the controller.

In addition, in the vacuum processing method of the invention, it is preferable that the information-processing device has a transmitting device that transmits the information detected by the detecting device to the controller via a real-time wireless communication. In the case, the information transmitted by the transmitting device may be analyzed by the controller, so that a controlling state of the vacuum processing mechanism can be changed during the process.

In addition, in the vacuum processing method of the invention, if the sensor substrate has one or more microscopic holes and the detecting device is arranged in the microscopic holes, the detecting device can detect a state in a course of a microscopic-hole forming process that is one manner of the vacuum process. Especially, if a plurality of aspect ratios are set for a plurality of microscopic holes, a plurality of vacuum-state information corresponding to a plurality of courses can be obtained.

In addition, in the vacuum processing method of the invention, it is preferable that the detecting device is adapted to detect one of a power density, a $V_{dc}$, a $\Delta V_{dc}$, infrared-ray intensity, ultraviolet-ray intensity, visible-ray intensity, temperature, molecular weight, ion current, acceleration, a distortion, a displacement and a sound.

Next, this invention is a sensor substrate to be placed on a stage of a vacuum processing unit that includes the stage to place a substrate to be processed thereon; the sensor substrate being formed in such a manner that the sensor substrate has substantially the same shape and substantially the same size as the substrate to be processed placed on the stage; and the sensor substrate having a detecting device that detects information about a vacuum processing state and an information-processing device that processes the information detected by the detecting device.

According to the sensor substrate of the invention, since the sensor substrate is formed in such a manner that the sensor substrate has substantially the same shape and substantially the same size as the substrate to be processed, the detecting device can detect information about a vacuum processing state which is very useful for a vacuum process to the substrate to be processed.

In addition, according to the sensor substrate of the invention, since the information-processing device can process the information detected by the detecting device, a process of transmitting the detected information is more convenient.

In the sensor substrate of the invention, if the vacuum process is a plasma process, in particular a plasma-etching process, it is especially effective that the sensor substrate has substantially the same shape and substantially the same size as the substrate to be processed, because identity of process environment such as gas flow environment can be secured.

In addition, in the sensor substrate of the invention, the substrate to be processed that is herein assumed is generally a semiconductor wafer or a glass substrate for an LCD.

In addition, in the sensor substrate of the invention, it is preferable that the information-processing device has a storing device that stores the information detected by the detecting device. In the case, for example, the information stored by the storing device is analyzed later.

In addition, in the sensor substrate of the invention, it is preferable that the information-processing device has a transmitting device that transmits the information detected by the detecting device to the vacuum processing unit via a real-time wireless communication. In the case, the information transmitted by the transmitting device is analyzed by the vacuum processing unit, so that a controlling state of the vacuum processing mechanism can be changed during the process.

Alternatively, the information can be transmitted to a high-speed/high-performance computer via an Internet or an Intranet, data-processed and/or analyzed by the computer and fed back to the vacuum processing unit as real-time information.

Alternatively, if the information is arranged into data following change in time of each characteristic, each process parameter can be changed to compensate for the change in time.

In addition, in the sensor substrate of the invention, if the sensor substrate has one or more microscopic holes and the detecting device is arranged in the microscopic holes, the detecting device can detect a state in a course of a microscopic-hole forming process that is one manner of the vacuum process. Especially, if a plurality of aspect ratios are set for a plurality of microscopic holes, a plurality of vacuum-state information corresponding to a plurality of courses can be obtained.

In addition, in the sensor substrate of the invention, it is preferable that the detecting device is adapted to detect one of a power density, a $V_{dc}$, a $\Delta V_{dc}$, infrared-ray intensity, ultraviolet-ray intensity, visible-ray intensity, temperature, molecular weight, ion current, acceleration, a distortion, a displacement and a sound.

Next, this invention is a vacuum processing unit comprising; a stage on which a substrate to be processed is adapted to be placed; a vacuum processing mechanism that conducts a vacuum process to the substrate to be processed placed on the stage; and a controller that controls the vacuum processing mechanism; wherein the controller is adapted to control the vacuum processing mechanism based on information from a sensor substrate that has substantially the same shape and substantially the same size as the substrate to be processed placed on the stage.

According to the vacuum processing unit of the invention, since the sensor substrate is formed in such a manner that the sensor substrate has substantially the same shape and substantially the same size as the substrate to be processed, the information about the vacuum processing state detected by the detecting device of the sensor substrate is very useful information for a vacuum process to the substrate to be processed.

In the vacuum processing unit of the invention, if the vacuum process is a plasma process, in particular a plasma-etching process, a great advantageous effect can be brought by that the sensor substrate has substantially the same shape and substantially the same size as the substrate to be processed, because identity of process environment such as gas flow environment can be secured.

In addition, in the vacuum processing unit of the invention, it is preferable that the substrate to be processed is a semiconductor wafer or a glass substrate for an LCD.

In addition, in the vacuum processing unit of the invention, it is preferable that the sensor substrate has a detecting device that detects information about a vacuum processing state and a storing device that stores the information detected by the detecting device. In the case, for example, the information stored by the storing device is transmitted to and analyzed by the controller.

In addition, in the vacuum processing unit of the invention, it is preferable that the sensor substrate has a detecting device that detects information about a vacuum processing state and a transmitting device that transmits the information detected by the detecting device to the controller via a real-time wireless communication. In the case, the information transmitted by the transmitting device is analyzed by the controller, so that a controlling state of the vacuum processing mechanism can be changed during the process.

In addition, in the vacuum processing unit of the invention, if the sensor substrate has one or more microscopic holes and the detecting device is arranged in the microscopic holes, the detecting device can detect a state in a course of a microscopic-hole forming process that is one manner of the vacuum process. Especially, if a plurality of aspect ratios are set for a plurality of microscopic holes, a plurality of vacuum-state information corresponding to a plurality of courses can be obtained.

In addition, in the vacuum processing unit of the invention, it is preferable that the detecting device is adapted to detect one of a power density, a $V_{dc}$, a $\Delta V_{dc}$, infrared-ray intensity, ultraviolet-ray intensity, visible-ray intensity, temperature, molecular weight, ion current, acceleration, a distortion, a displacement and a sound.

BRIEF DESCRIPTION OF THE DRAWINGS

FIG. 2 is a schematic view showing the sensor substrate of the vacuum processing unit of FIG. 1;

DESCRIPTION OF THE PREFERRED EMBODIMENT

Embodiments of the invention are explained with reference to drawings.

Figure 1:
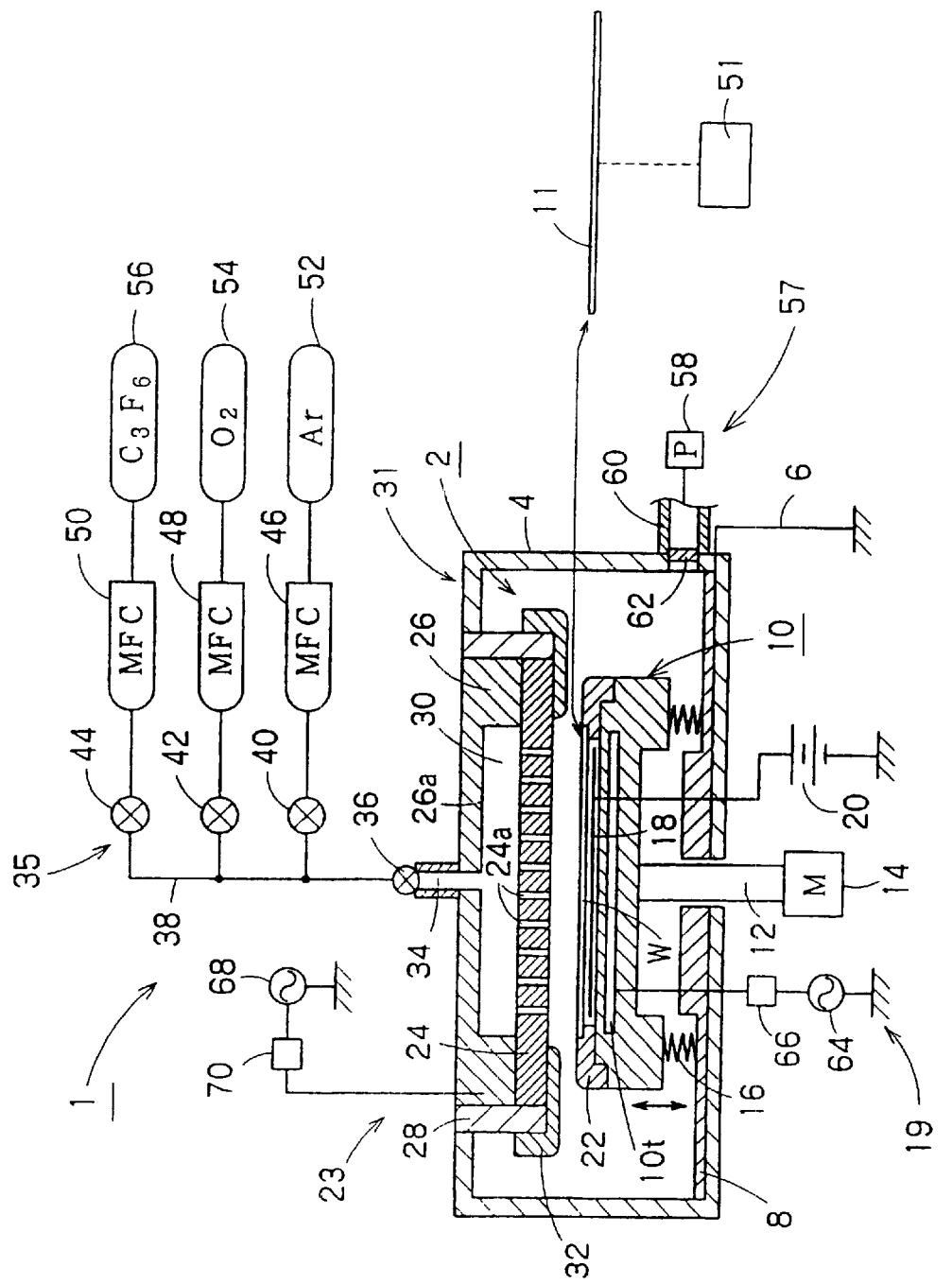
FIG. 1 is a schematic view showing a first embodiment of a vacuum processing unit according to the invention.

FIG. 1 is a schematic view showing a vacuum processing unit of a first embodiment according to the invention. As shown in FIG. 1, the vacuum processing unit 1 of the first embodiment according to the invention comprises: a stage 10 on which a substrate to be processed W is adapted to be placed; a vacuum processing mechanism 31 (see FIG. 3) that conducts a vacuum process to the substrate to be processed W placed on the stage 10; a controller 51 (see FIG. 3) that controls the vacuum processing mechanism 31; and a sensor substrate 11 that has substantially the same shape and substantially the same size as the substrate to be processed W placed on the stage 10.

In the embodiment, the vacuum process is a plasma-etching process. In addition, the substrate to be processed W is a semiconductor wafer or a glass substrate for an LCD.

FIG. 2(a) is a plan view of the sensor substrate 11. FIG. 2(b) is a perspective view of the sensor substrate 11. As shown in FIG. 2(a) and FIG. 2(B), the sensor substrate 11 has: a detecting device 11d that detects information about a vacuum processing state (a plasma-etching processing state); an information-processing device 11p that processes the information detected by the detecting device 11d; and a battery device 11b for driving the detecting device 11d and the information-processing device 11p. Methods of forming the respective devices are not limited, but may adopt a technique disclosed by Japanese Patent Laid-Open Publication No.7-12667. In addition, an $SiO_2$ film is formed on a surface of the sensor substrate 11.

In the embodiment, the information-processing device 11p has: a preprocessing device 11q that preprocesses the information detected by the detecting device 11d into a state suitable for being stored; and a storing device 11m that stores the information preprocessed by the preprocessing device 11q.

The detecting device 11d consists of a plurality of detecting elements, each of which is suitable for detecting each of a power density (watt/cm$^2$), a $V_{dc}$ (V), a $\Delta V_{dc}$ (V), infrared-ray intensity, ultraviolet-ray intensity, visible-ray intensity, temperature (°C.), molecular weight, ion current (A), acceleration (m/s$^2$), a distortion, a displacement and a sound. In FIG. 2(a) and FIG. 2(b), only some detecting elements 11d are shown. Each detecting element 11d is adapted to detect the information at a sampling interval, which is properly set.

The preprocessing device 11q can calculate respective averages for respective detected data within a predetermined time (which corresponds to a low-pass filtering process). Alternatively, the preprocessing device 11q can calculate a median or an average for each kind of detected information if a plurality of detecting elements are provided for detecting the kind of information. In addition, the preprocessing device 11q can also conduct a highly advanced information process such as a data-compression process.

The vacuum processing mechanism 31 in the embodiment has: a processing container 4 which contains a stage 10 and in which a vacuum can be created; a temperature adjusting means 10t provided inside the stage 10; a lower-electrode system 19, an upper-electrode system 23; a vacuum-creating system 57 that creates the vacuum in the processing container 4; and a gas-supply system 35 that supplies respective gases into the processing container 4.

Figure 3:
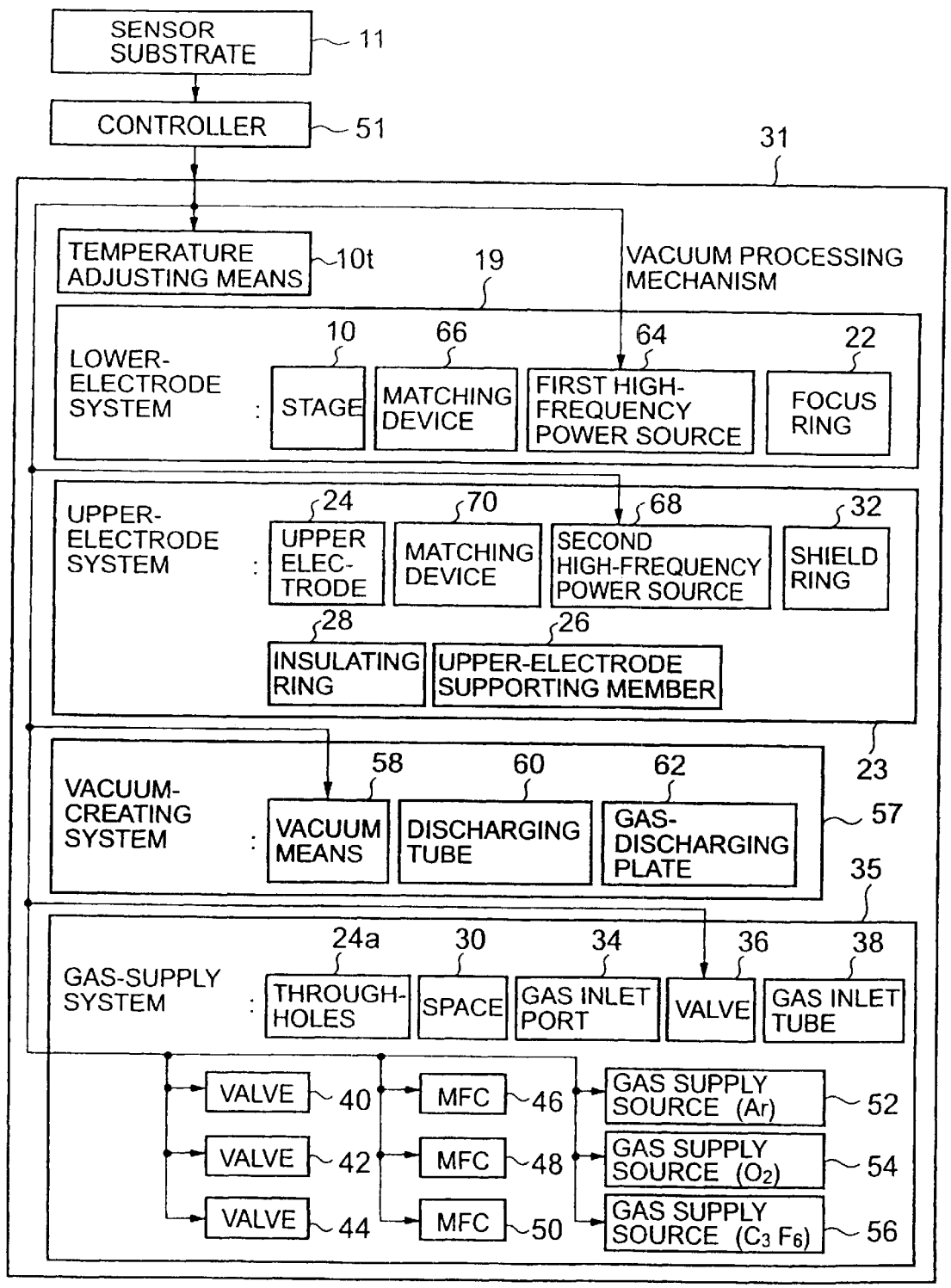
FIG. 3 is a chart showing an information flow of the vacuum processing unit of FIG. 1.

The controller 51 is adapted to control the vacuum processing mechanism 31 based on the information from the sensor substrate 11. A flow of the information (signal) is shown in FIG. 3.

The vacuum processing unit 1 of the embodiment shown in FIG. 1 is explained in more detail.

The processing container 4 is formed into a substantially cylindrical shape by for example aluminum whose surface has been subjected to an anodic oxidation process, and forms a processing chamber 2 that can be hermetically closed. The processing container 4 itself is connected to ground via a ground wire 6.

An insulating support plate 8, which is made of for example ceramics or the like, is provided in a base portion of the processing chamber 2. A substantially cylindrical stage 10, which is for placing thereon the substrate to be processed W such as a 6-inch wafer and the sensor substrate 11 having substantially the same shape and substantially the same size as the substrate to be processed W, is contained in a vertically movable manner above the insulating support plate 8.

The stage 10 is supported by an elevation shaft 12 that freely passes through the insulating support plate 8 and a base portion of the processing container 4. The elevation shaft 12 is vertically movable by means of a driving motor 14 disposed outside the processing container 4. Thus, when the driving motor 14 operates, the stage 10 can be vertically moved in a direction shown by a two-way arrow in FIG. 1. The substrate to be processed W and the sensor substrate 11 can be introduced onto and taken away from the stage 10 properly by a conveying means not shown.

As the conveying means, for example, a multi-joint robot arm whose tip is provided with a substrate holder is widely used. Such a conveying means may be provided in a load-lock chamber adjacently connected to the processing container in such a manner that the substrate holder with holding the substrate can pass through a gate provided in a partition between the processing container and the load-lock chamber. By means of the conveying means, the substrate to be processed W or the sensor substrate 11 can be introduced into and taken away from the processing container.

An electrostatic chuck 18 for sticking to and holding the substrate to be processed W or the sensor substrate 11 is provided on the stage 10. The electrostatic chuck 18 may have for example a structure wherein an electric conductive thin film is sandwiched between upper and lower polyimide resin elements, and may be adapted to be applied a voltage such as a voltage of 1.5 kV to 2.0 kV from a high-voltage direct-current source 20 that is disposed outside the processing container 4. By means of coulomb force created by applying the voltage, the substrate to be processed W or the sensor substrate 11 is adapted to be stuck to and held by an upper surface of the electrostatic chuck 18.

In addition, in order to secure airtightness of the processing chamber 2, an extendable hermetic member such as a bellows 16 is arranged around the elevation shaft 12 between the stage 10 and the insulating support plate 8.

The stage 10 is made of for example aluminum, whose surface has been subjected to an anodic oxidation process, and has a temperature adjusting means 10t therein. The temperature adjusting means 10t may consist of: a heating means, such as a ceramics heater; and a cooling-medium circulating way, which is to cause a cooling medium from an outside cooling-medium source to circulate. Thus, by controlling the temperature adjusting means 10t, it is possible to maintain a temperature of the substrate to be processed W or the sensor substrate 11 on the stage 10 within a desired range.

The stage 10 itself forms a lower electrode, and is connected to a first high-frequency power source 64 via a matching device 66. The first high-frequency power source 64 is adapted to output a high frequency power whose frequency is about several hundred kHz, for example 800 kHz, for the stage 10.

On a peripheral part of the stage 10 on the upper surface side, a substantially circular focus ring 22 is disposed surrounding the electrostatic chuck 18. The focus ring 22 is made of a material that has insulating performance, for example quartz, and has a function to cause ions in the plasma described below effectively to reach the substrate to be processed W or the sensor substrate 11.

The lower-electrode system 19 consists of the matching device 66, the first high-frequency power source 64 and the focus ring 22, which are explained above. In the lower-electrode system 19, the first high-frequency power source 64 is connected to the controller 51, and is adapted to be controlled by the controller 51.

A substantially disk-shaped upper electrode 24 is arranged at an upper position facing a placing surface of the stage 10. The upper electrode 24 is made of an electric conductive material, such as single-crystal Silicon, and has a plurality of through-holes 24a. An upper-electrode supporting member 26 that is made of an electric conductive material, such as aluminum, and that has substantially the same diameter as the upper electrode 24 is arranged above the upper electrode 24. An insulating ring 28 is provided on outside circumferential surfaces of the upper electrode 24 and the upper-electrode supporting member 26.

The upper electrode 24 is connected to a second high-frequency power source 68 via the upper-electrode supporting member 26 and a matching device 70. The second high-frequency power source 68 is adapted to output a high frequency power whose frequency is greater than that of the first high-frequency power source 64 and not less than 1 MHz, for example 27.12 MHz, for the upper electrode 24.

A substantially circular shield ring 32 that is made of a material having insulating performance, such as quartz, is arranged from a lower peripheral portion of the upper electrode 24 to a substantially central portion of an outside curcumferential surface of the insulating ring 28. The shield ring 32 has a function to form a gap together with the focus ring 22 and to restrain a diffusion of plasma, the gap being narrower than the gap between the electrostatic chuck 18 and the upper electrode 24.

The upper-electrode system 23 consists of the upper electrode 24, the upper-electrode supporting member 26, the matching device 70, the second high-frequency power source 68, the insulating ring 28 and the shield ring 32, which are explained above. In the upper-electrode system 23, the second high-frequency power source 68 is connected to the controller 51, and is adapted to be controlled by the controller 51.

A vacuum means 58 such as a vacuum pump is connected to a lower portion of the processing container 4 via a discharging tube 60. Thus, a vacuum of an optional level such as several mTorr to several hundred mTorr can be created in the processing chamber 2 via a gas-discharging plate 62 consisting of for example a punch plate, and the vacuum can be maintained.

The vacuum-creating system 57 consists of the vacuum means 58, the discharging tube 60 and the gas-discharging plate 62, which are explained above. In the vacuum-creating system 57, the vacuum means 58 is connected to the controller 51, and is adapted to be controlled by the controller 51.

An opening 26a is formed in the upper-electrode supporting member 26 on a side of the upper electrode 24. The opening 26a forms a space 30 between itself and the upper electrode 24. A gas inlet port 34 is connected to a substantially central upper portion of the space 30. A gas inlet tube 38 is connected to the gas inlet port 34 via a valve 36.

Respective corresponding gas supply sources 52, 54 and 56 are connected to the gas inlet tube 34 via valves 40, 42 and 44 and mass flow controllers (MFC) 46, 48 and 50 that are for adjusting respective corresponding flow rates.

For example, Ar can be freely supplied from the gas supply source 52. For example, $O_2$ can be freely supplied from the gas supply source 54. For example, $C_3F_6$ or C—$C_3F_6$ (C— means cyclic compound) can be freely supplied from the gas supply source 56. The respective gases from the gas supply sources 52, 54 and 56 are introduced into the processing chamber 2 via the gas inlet tube 38, the gas inlet port 34, the space 30 and the through-holes 24a, and then uniformly flow toward a surface to be processed of the substrate to be processed W or the sensor substrate 11.

The gas-supply system 35 consists of the through-holes 24a, the space 30, the gas inlet port 34, the valve 36, the gas inlet tube 38, the valves 40, 42 and 44, the mass flow controllers (MFC) 46, 48 and 50, and the gas supply sources 52, 54 and 56, which are explained above. In the gas-supply system 35, the respective valves 36, 40, 42 and 44, the respective MFC 46, 48 and 50, and the respective gas supply sources 52, 54 and 56 are connected to the controller 51, and are adapted to be controlled by the controller 51.

Next, an operation in a case wherein an etching process is conducted to a substrate to be processed W, which consists of for example $SiO_2$, by using the above etching unit 1 is explained below.

At first, the sensor substrate 11 is placed on the stage 10. Then, a predetermined voltage from the high-voltage direct-current source 20 is applied to the electric conductive thin film in the electrostatic chuck 18, so that the sensor substrate 11 is sucked to and hence held by the electrostatic chuck 18.

The stage 10 is adjusted to a predetermined temperature by means of the temperature adjusting means 10t. The temperature adjusting means 10t is controlled to set a surface temperature of the sensor substrate 11 held on the stage 10 at a desired temperature (for example, not more than 120° C.) by the controller 51 when the substrate is processed.

Then, a vacuum is created in the processing chamber 2 by means of the vacuum means 58. In addition, gases necessary for the etching process are supplied at respective predetermined rates from the gas supply sources 52, 54 and 56, so that a pressure in the processing chamber 2 is set and maintained at a predetermined vacuum level such as 40 mTorr.

Herein, the respective gases Ar, $O_2$ and $C_3F_6$ supplied from the gas supply sources 52, 54 and 56 are adjusted to predetermined flow rates by means of respective corresponding mass-flow controllers 46, 48 and 50 and valves 40, 42 and 44 by the controller 51. For example, the flow rates of the respective gases are adjusted in such a manner that a flow-rate ratio of $O_2$ to $C_3F_6$ is $0.1 \leq O_2/C_3F_6 \leq 1.0$, and open levels of the respective valves 40, 42 and 44 are adjusted in such a manner that a partial pressure of $C_3F_6$ is 0.5 mTorr to 2.0 mTorr. The respective gases Ar, $O_2$ and $C_3F_6$ are mixed and introduced onto the sensor substrate 11 via the gas inlet tube 38, the gas inlet port 34, the space 30 and the through-holes 24a.

Then, a high-frequency electric power having a frequency of 27.12 MHz and a power such as 2 kW is supplied to the upper electrode 24 from the second high-frequency power source 68, so that plasma is generated between the upper electrode 24 and the stage 10. At the same time, a high-frequency electric power having a frequency of 800 kHz and a power such as 1 kW is supplied to the stage 10 from the first high-frequency power source 64.

The process gas in the processing chamber 2 is decomposed by the generated plasma to generate etchant ions. The etchant ions etch the $SiO_2$ film of the surface of the sensor substrate 11, while incident speed of the etchant ions are controlled by the relatively low high-frequency supplied to the stage 10.

In the etching process, the detecting device 11d of the sensor substrate 11 detects various information, i.e., each of the power density (watt/$cm^2$), the $V_{dc}$ (V), the $\Delta V_{dc}$ (V), the infrared-ray intensity, the ultraviolet-ray intensity, the visible-ray intensity, the temperature (°C.), the molecular weight, the ion current (A), the acceleration (m/$s^2$), the distortion, the displacement and the sound, at the sampling interval that is properly set.

The preprocessing device 11q of the sensor substrate 11 preprocesses the information detected by the detecting device 11d into a state suitable for stored. For example, the preprocessing device 11q may calculate respective averages for respective detected data within a predetermined time (which corresponds to a low-pass filtering process). Alternatively, the preprocessing device 11q may calculate a median or an average for each kind of detected information if a plurality of detecting elements are provided for detecting the same kind of information. In addition, the preprocessing device 11q may also conduct a highly advanced information process such as a data-compression process.

Then, the storing device 11m of the sensor substrate 11 stores the information preprocessed by the preprocessing device 11q.

After a series of etching processes is completed, the sensor substrate 11 is removed away from the stage 10. Then, the stored information is read out from the storing device 11m of the sensor substrate 11, and a state of the series of etching processes is analyzed based on the information. Based on the result of the analysis, a controlling process of the controller 51 for an etching process to the substrate to be processed W is determined.

If a sufficiently proper controlling process of the controller 51 is not determined, a sensor substrate 11 is placed on the stage 10 again, and an etching process is repeated for example while various controlling substances by the controller 51 are changed.

If a sufficiently proper controlling process of the controller 51 is determined, a substrate to be processed W is placed on the stage 10. Then, a predetermined voltage from the high-voltage direct-current source 20 is applied to the electric conductive thin film in the electrostatic chuck 18, so that the substrate to be processed W is sucked to and hence held by the electrostatic chuck 18.

The stage 10 is adjusted to a predetermined temperature by means of the temperature adjusting means 10t. At that time, the temperature adjusting means 10t is controlled to set a surface temperature of the substrate to be processed W held on the stage 10 at a desired temperature (for example, not more than 120° C.) by the controller 51 when the substrate is processed, in accordance with the determined controlling process.

Then, a vacuum is created in the processing chamber 2 by means of the vacuum means 58. In addition, gases necessary for the etching process are supplied at respective predetermined rates from the gas supply sources 52, 54 and 56, so that a pressure in the processing chamber 2 is set and maintained at a predetermined vacuum level such as 40 mTorr.

Herein, the respective gases Ar, $O_2$ and $C_3F_6$ supplied from the gas supply sources 52, 54 and 56 are adjusted to predetermined flow rates by means of respective corresponding mass-flow controllers (MFC) 46, 48 and 50 and valves 40, 42 and 44 by the controller 51, in accordance with the determined controlling process. For example, the flow rates of the respective gases are adjusted in such a manner that a flow-rate ratio of $O_2$ to $C_3F_6$ is $0.1 \leq O_2/C_3F_6 \leq 1.0$, and open levels of the respective valves 40, 42 and 44 are adjusted in such a manner that a partial pressure of $C_3F_6$ is 0.5 mTorr to 2.0 mTorr. The respective gases Ar, $O_2$ and $C_3F_6$ are mixed and introduced onto the substrate to be processed W via the gas inlet tube 38, the gas inlet port 34, the space 30 and the through-holes 24a.

Then, in accordance with the determined controlling process, a high-frequency electric power having a frequency of 27.12 MHz and a power such as 2 kW is supplied to the upper electrode 24 from the second high-frequency power source 68, so that plasma is generated between the upper electrode 24 and the stage 10. At the same time, a high-frequency electric power having a frequency of 800 kHz and a power such as 1 kW is supplied to the stage 10 from the first high-frequency power source 64.

The process gas in the processing chamber 2 is decomposed by the generated plasma to generate etchant ions. The etchant ions etch the $SiO_2$ film of the surface of the substrate to be processed W, while incident speed of the etchant ions are controlled by the relatively low high-frequency supplied to the stage 10. The etching process to the surface of the substrate to be processed W is conducted very precisely based on the information obtained by the sensor substrate 11.

As described above, according to the embodiment, since the sensor substrate 11 has substantially the same shape and substantially the same size as the substrate to be processed W, identity of etching process environment such as gas flow environment when the information is detected by the sensor substrate 11 can be secured. Thus, the information about the vacuum processing state detected by the sensor substrate 11 becomes very useful information for the vacuum process to the substrate to be processed W.

In addition, according to the embodiment, since the preprocessing device 11q of the sensor substrate 11 can calculate respective averages for respective detected data within a predetermined time, or calculate respective medians or respective averages for a plurality of detected information, or conduct a highly advanced information process such as a data-compression process, a process of transmitting the detected information is more convenient.

In addition, according to the embodiment, since the storing device 11m of the sensor substrate 11 stores the information preprocessed by the preprocessing device 11q, it is easy to analyze the information later.

In addition, although the detecting device 11d of the embodiment is adapted to detect each of the power density (watt/$cm^2$), the $V_{dc}$ (V), the $\Delta V_{dc}$ (V), the infrared-ray intensity, the ultraviolet-ray intensity, the visible-ray intensity, the temperature (°C.), the molecular weight, the ion current (A), the acceleration (m/$s^2$), the distortion, the displacement and the sound, the detecting device 11d may be adapted to detect only one or some of them.

For example, based on the temperature information detected by the detecting device 11d, an operating pattern of a temperature controlling means such as a chiller can be changed. In addition, the chiller is caused to have a memory into which data can be written or a CPU, and an operating pattern stored in the memory can be carried out.

Alternatively, based on the acceleration information detected by the detecting device 11d, if data of acceleration is differentiated to obtain external (local minimum or maximum) values and the number of switching between positive and negative at the external values is counted, the number of oscillation of the sensor substrate can be detected. The information is useful in reducing particles that may be generated when the substrate is conveyed by for example a conveying arm or the like. That is, if the conveying arm or the like is adjusted suitably to restrain the generation of oscillation when the substrate is conveyed, the generation of particles can be prevented.

In addition, if an acoustic sensor is used as the detecting device 11d in order to catch a creak of a conveying arm or the like, it becomes easy to early detect an abnormal state. In addition, if a conveying system is set to automatically stop when a predetermined pattern of an acoustic signal is received, any accident involving a damage of the substrate, which may be caused by an abnormal state of the conveying system, can be prevented.

If the $V_{dc}$ is changed because of a deterioration with age of the focus ring, it is effective for the detecting device 11d to detect the $V_{dc}$ (V) or the $\Delta V_{dc}$ (V). In the case, a good vacuum process can be tentatively carried out by changing a process parameter before its lifetime.

In addition, if an optical sensor is used as the detecting device 11d, for example, blinking of a plasma light, which may be caused by an abnormal discharge of the plasma, can be detected and an alarm can be operated. Furthermore, if a plurality of optical sensors is preferably arranged in a matrix, a site where the abnormal discharge happens can be roughly determined based on distribution of received light intensity. This becomes a useful positional information for quickly confirming an actual discharge trace by the eye. In addition, it becomes easy to take measures thereof by determining the discharge position.

If a dry cleaning process is conducted for the process chamber, it is preferable that the detecting device 11d is a sensor that can judge whether the dry cleaning process is normally completed or not, for example a gas sensor or an optical sensor.

A substrate to be processed W is not limited to the semiconductor wafer or the glass substrate for an LCD. In addition, a vacuum processing unit is not limited to the dry-etching processing unit, but may be various etching processing units or any other vacuum processing unit than the etching processing unit.

Figure 4:
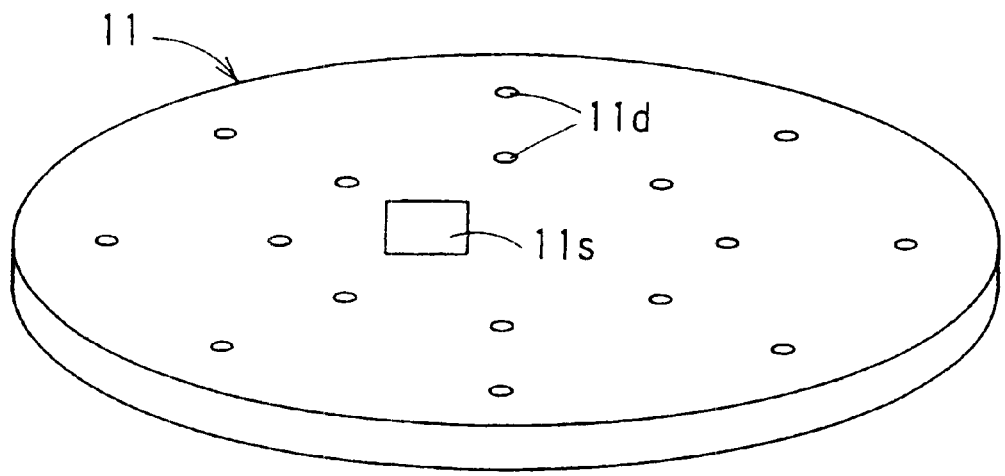
FIG. 4 is a schematic view showing a sensor substrate of a second embodiment of a vacuum processing unit according to the invention.

Next, a vacuum processing unit of a second embodiment according to the invention is explained with reference to FIG. 4. FIG. 4 is a schematic view showing a sensor substrate of the vacuum processing unit of the second embodiment.

As shown in FIG. 4, instead of the storing device 11m, the vacuum processing unit 1 of the embodiment has a transmitting device 11s that transmits the information detected by the detecting device 11d to the controller 51 via a real-time wireless communication. The controller 51 is adapted to analyze the information transmitted by the transmitting device 11s. Other structure is the same as the first embodiment shown in FIGS. 1 and 2. In the second embodiment, the same numeral references correspond to the same structures as the first embodiment shown in FIGS. 1 and 2. The explanation of the same structures is not repeated.

According to the embodiment, since the information about the vacuum processing state can be obtained via the real-time communication, controlling substances of the controller 51 can be changed while the substrate is processed. Thus, a proper controlling process of the controller 51 can be determined efficiently.

In addition, according to the embodiment, when a dangerous state for protection of the unit is generated while the vacuum process is conducted to the sensor substrate 11, the state can be indicated by an alarm or the like, the controller 51 can be adjusted to avoid the state, and /or the process can be suspended.

In the embodiment, the transmitting device 11s is provided instead of the storing device 11m. However, the sensor substrate 11 may have both the storing device 11m and the transmitting device 11s.

Figure 5:
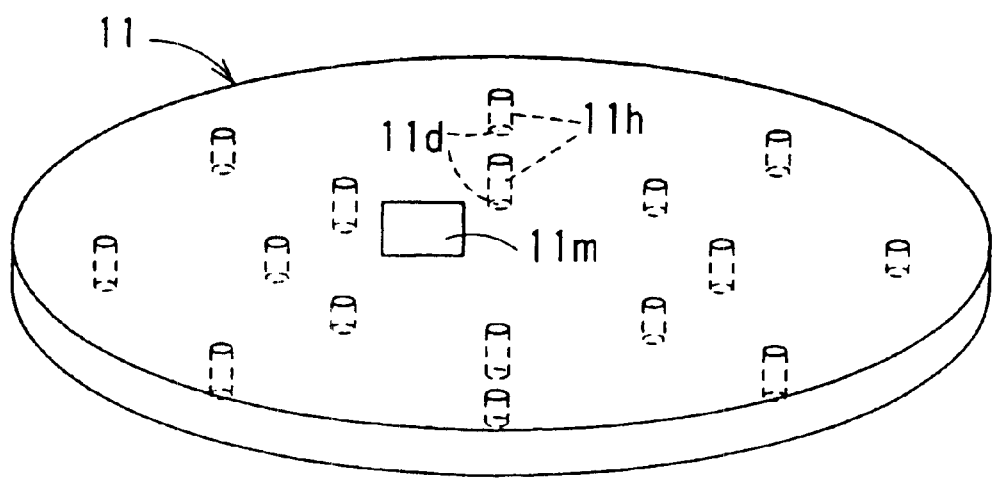
FIG. 5 is a schematic view showing a sensor substrate of a third embodiment of a vacuum processing unit according to the invention.
Figure 6:
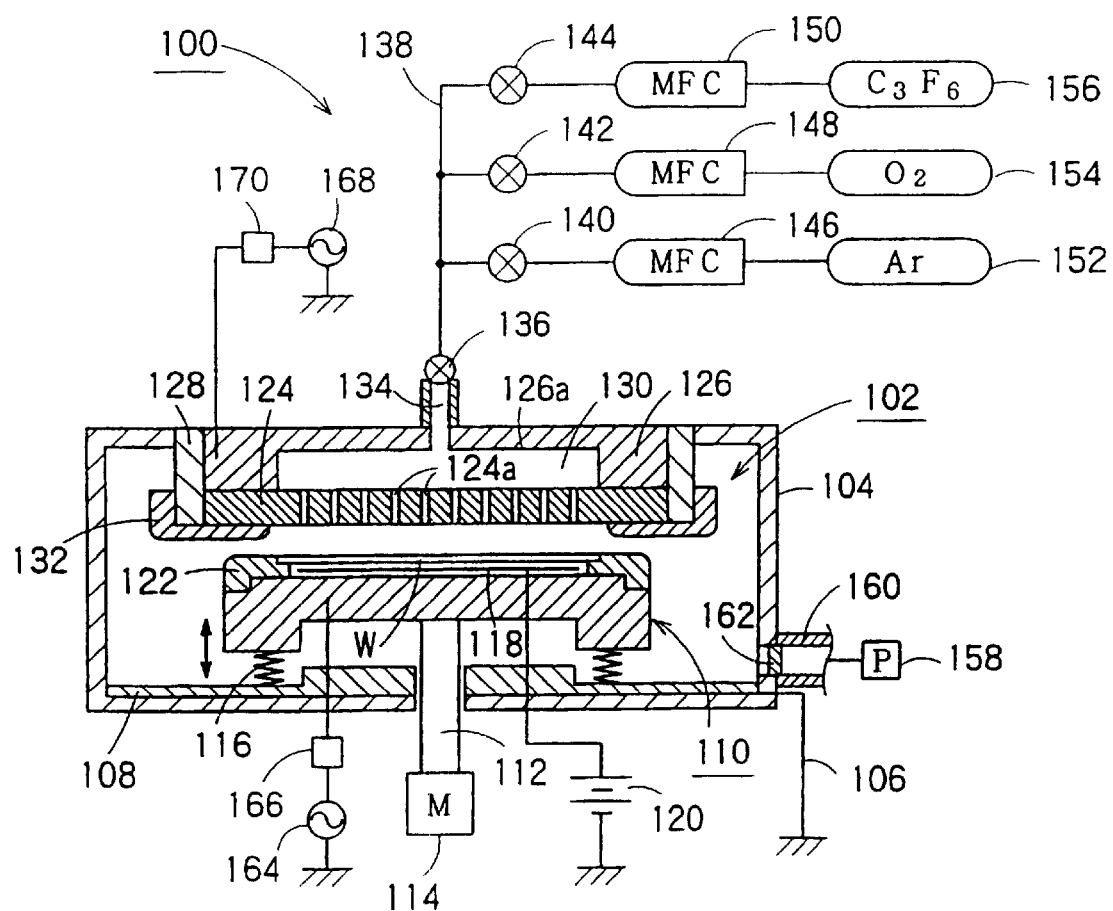
FIG. 6 is a schematic view showing a conventional etching unit.
Figure 7:
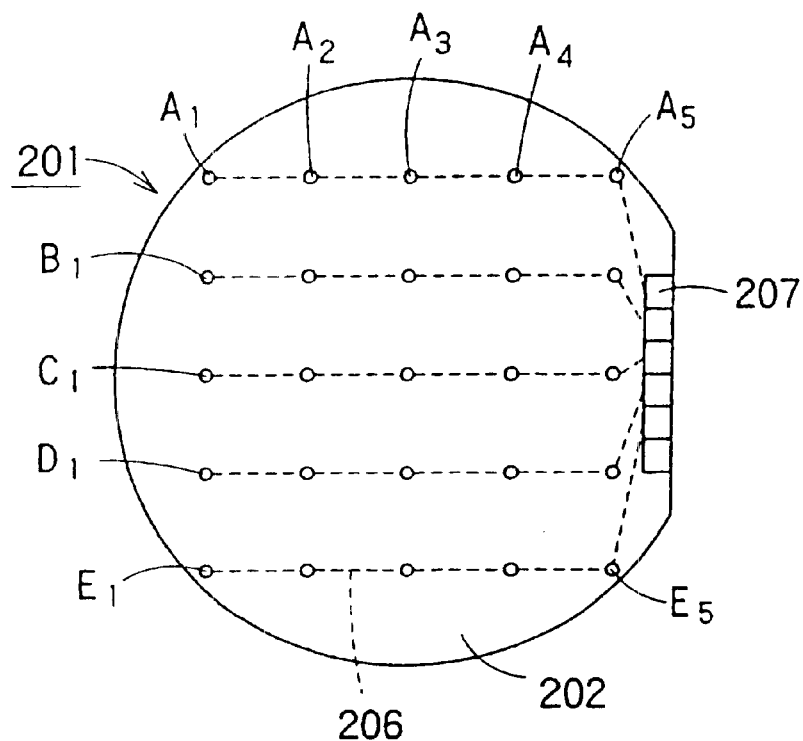
FIG. 7 is a plan view of a conventional wafer for a temperature measurement.
Figure 8:
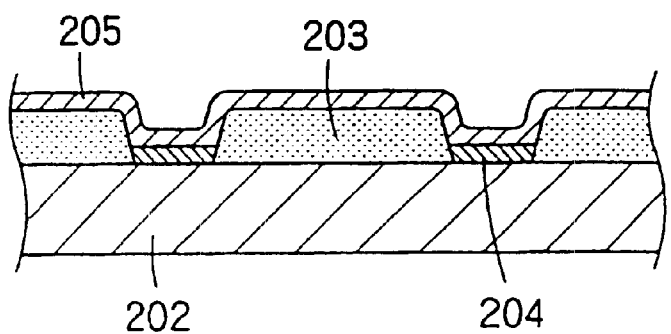
FIG. 8 is an enlarged partial side view of the conventional wafer for the temperature measurement.

Next, a vacuum processing unit of a third embodiment according to the invention is explained with reference to FIG. 5. FIG. 5 is a schematic view showing a sensor substrate of the vacuum processing unit of the third embodiment.

As shown in FIG. 5, in the vacuum processing unit 1 of the embodiment, the sensor substrate 11 has a plurality of microscopic holes 11h, and the detecting device 11d is arranged in each of the microscopic holes 11h. Other structure is the same as the first embodiment shown in FIGS. 1 and 2. In the third embodiment, the same numeral references correspond to the same structures as the first embodiment shown in FIGS. 1 and 2. The explanation of the same structures is not repeated.

According to the embodiment, the detecting device 11d can detect a state in a course of a microscopic-hole forming process that is one manner of the vacuum process.

For example, the microscopic-hole 11h has a diameter of 0.18 $\mu$m and a depth of 2 $\mu$m. If a plurality of aspect ratios (depth/diameter) are set for a plurality of microscopic holes, a plurality of vacuum-state information corresponding to a plurality of courses can be obtained.

As described above, according to the invention, since the sensor substrate is formed in such a manner that the sensor substrate has substantially the same shape and substantially the same size as the substrate to be processed, the information about the vacuum processing state detected by the detecting device of the sensor substrate becomes very useful information for a vacuum process to the substrate to be processed.

In addition, according to the invention, since the information detected by the detecting device is processed by the information-processing device of the sensor substrate, a process of transmitting the detected information is more convenient.

What is claimed is:

1. A substrate processing method of using
    a processing unit including a process mechanism that conducts a predetermined process with a substrate to be processed, a conveying mechanism that conveys the substrate to be processed into and out of the processing mechanism, and a controlling mechanism that controls the conveying mechanism, and
    a sensor substrate having a detecting device that detects acceleration or sound, said method comprising:
        a step of conveying the sensor substrate by means of the conveying mechanism while the detecting device detects acceleration or sound to thereby obtain detected information; and a step of conveying the substrate to be processed while controlling the conveying mechanism by means of the controlling mechanism, based on the detected information.

2. A substrate processing method according to claim 1, wherein:

the substrate to be processed is a semiconductor wafer or a glass substrate for an LCD.

3. A substrate processing method according to claim 1, wherein:

the sensor substrate has a storing device that stores the information detected by the detecting device.

4. A substrate processing method according to claim 1, wherein:

the sensor substrate has a transmitting device that transmits the information detected by the detecting device to the controlling mechanism via a real-time wireless communication.

5. A sensor substrate that can be conveyed by a conveying mechanism of a substrate processing unit, the sensor substrate having substantially the same shape and substantially the same size as a substrate to be processed, a microscopic hole, and a detecting device arranged in the microscopic hole, the detecting device detecting a state in a course of a microscopic-hole forming process for a substrate to be processed.

6. A sensor substrate according to claim 5, wherein:

the substrate to be processed is a semiconductor wafer or a glass substrate for an LCD.

7. A sensor substrate according to claim 5, wherein:

the sensor substrate has a storing device that stores the information detected by the detecting device.

8. A substrate processing method according to claim 5, wherein:

the sensor substrate has a transmitting device that transmits the information detected by the detecting device to the controlling mechanism via a real-time wireless communication.

9. A substrate processing unit adapted for use with a sensor substrate having a detecting device that detects acceleration or sound to provide detection information, said substrate processing unit comprising;

a process mechanism that conducts a predetermined process with a substrate to be processed;

a conveying mechanism that conveys a substrate to be processed or a sensor substrate into and out of the processing mechanism; and a controlling mechanism that controls the conveying mechanism according to detection information received from the sensor substrate.

10. A substrate processing unit according to claim 9, wherein:

the substrate to be processed is a semiconductor wafer or a glass substrate for an LCD.

11. A substrate processing method according to claim 1, wherein the sensor substrate has substantially the same shape and substantially the same size as the substrate to be processed.

12. A sensor substrate according to claim 5, wherein the microscopic hole has a first aspect ratio; and the sensor substrate also has a second microscopic hole and a second detecting device arranged in the second microscopic hole, the second microscopic hole having a second aspect ratio, and the second detecting device also detecting a state in a course of a microscopic-hole forming process.

13. A substrate processing unit according to claim 9, wherein the sensor substrate has substantially the same shape and substantially the same size as the substrate to be processed.

* * * * *